United States Patent [19]
Okada et al.

[11] 3,939,433
[45] Feb. 17, 1976

[54] FEEDBACK CIRCUIT

[75] Inventors: Tomoyuki Okada, Katsuta; Seiji Suda, Mito, both of Japan

[73] Assignee: Hitachi, Ltd., Japan

[22] Filed: Feb. 12, 1974

[21] Appl. No.: 441,856

[30] Foreign Application Priority Data
Feb. 16, 1973 Japan................................. 48-18266

[52] U.S. Cl. ................. 330/25; 330/30 D; 330/108; 330/110
[51] Int. Cl.² .......................................... H03G 3/30
[58] Field of Search ....... 330/9, 25, 30 D, 108, 110, 330/95

[56] References Cited
UNITED STATES PATENTS

| | | |
|---|---|---|
| 2,876,299 | 3/1959 | Robins............................ 330/108 X |
| 3,451,006 | 6/1969 | Grangaard, Jr. ................ 330/108 X |
| 3,700,920 | 10/1972 | Eyler............................ 330/30 D X |

*Primary Examiner*—R. V. Rolinec
*Assistant Examiner*—Lawrence J. Dahl
*Attorney, Agent, or Firm*—Craig & Antonelli

[57] ABSTRACT

A feedback circuit for feeding back the output voltage of a comparing amplifier to the input circuit of the comparing amplifier for causing a steep change in the output voltage so as to stabilize the operation of the succeeding circuit. The feedback circuit includes means for applying the feedback voltage to a low potential portion of the input circuit of the comparing amplifier.

7 Claims, 7 Drawing Figures

FEEDBACK CIRCUIT

This invention relates to feedback circuits and more particularly to a feedback circuit which is suitable for use with a comparing amplifier so that a steeply changing output voltage can appear at the output terminal of the comparing amplifier.

An operational amplifier is frequently used without any negative power supply. When a switching circuit having a low operating level is connected to the output terminal of such operational amplifier, the operational amplifier tends to operate instably even when a feedback circuit is added thereto. A level detector utilizing an operational amplifier is frequently operated in such a manner that a reference potential which is positive relative to the ground potential is applied to the (−) input terminal of the operational amplifier, a detected potential is applied to the (+) input terminal of the operational amplifier, and an output voltage obtained as a result of comparison between these two potentials is used to cause operation of a switching circuit connected to the output terminal of the operational amplifier. In such a case, it is common practice to apply positive feedback in order that the output voltage of the operational amplifier can make a steep change. However, in case the reference potential applied to the operational amplifier is obtained by dividing the voltage of a power supply, a sufficient feedback function cannot be obtained when the operating level of the succeeding circuit connected to the output terminal of the operational amplifier is low as above described. Suppose that $V_{1A}$, $V_{1B}$ and $V_{1C}$ are the reference voltage, detected voltage and output voltage respectively. Then, the output voltage $V_{1C}$ appears from the operational amplifier in the region in which $V_{1A} < V_{1B}$. This output voltage $V_{1C}$ is low when the difference betwen $V_{1A}$ and $V_{1B}$ is very small. The relation $V_{1A} < V_{1C}$ must hold for the feedback of this output voltage $V_{1C}$ to the input circuit of the operational amplifier. However, when the operating level $V_B$ of the succeeding circuit connected to the output terminal of the operational amplifier is lower than $V_{1A}$ or $V_{1A} > V_B$, the succeeding circuit would operate before the feedback is started resulting in an unstable operation.

It is therefore an object of the present invention to provide a feedback circuit for use with an operational amplifier which can reliably operate even when a network having a low operating level may be connected to the output terminal of the operational amplifier.

Another object of the present invention is to provide a feedback circuit which is suitable for use with an operational amplifier of the kind which operates without any negative power supply.

In accordance with the present invention, there is provided a feedback circuit for use in a level detector having a comparing amplifier, means for applying a reference voltage and a detected signal voltage to the input terminal circuit of said comparing amplifier, and means for feeding the output voltage of said comparing amplifier back to the input terminal circuit of said comparing amplifier, said feedback circuit comprising feedback means connected at one end thereof to the output terminal of said comparing amplifier and at the other end thereof to a portion of said input terminal circuit where the voltage is lower than said reference voltage.

Other objects, features and advantages of the present invention will be apparent from the following detailed description taken in conjunction with the accompanying drawings, in which:

FIGS. 1b and 1c are graphic illustrations of the operation of the circuit shown in FIG. 1a;

FIGS. 2b and 2c are graphic illustrations of the operation of the circuit shown in FIG. 2a.

Figure 1A:
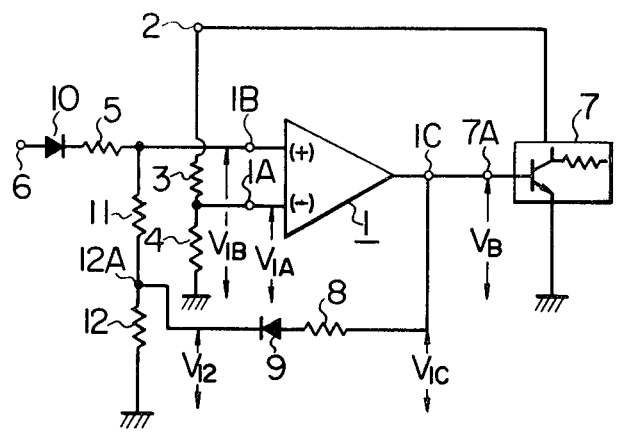
FIG. 1a is a circuit diagram of an embodiment of the present invention.

An embodiment of the present invention will be described with reference to a level detector of the kind in which a reference potential is applied to the (−) input terminal of an operational amplifier as shown in FIG. 1a.

Referring to FIG. 1a, the (−) input terminal 1A of an operational amplifier 1 is connected to a positive power supply terminal 2 so that a reference voltage obtained by dividing the power supply voltage by voltage dividing resistors 3 and 4 can be applied to the input terminal 1A. The (+) input terminal 1B of the operational amplifier 1 is connected to a detected signal input terminal 6 through a resistor 5 and a reverse current blocking diode 10, and voltage dividing resistors 11 and 12 are connected across this input terminal 1B and ground. The output terminal 1C of the operational amplifier 1 is connected to an input terminal 7A of a switching circuit 7 including a switching transistor. This output terminal 1C is further connected through a resistor 8 and a diode 9 to the voltage dividing point 12A between the voltage dividing resistors 11 and 12 to constitute a feedback circuit. The voltage $V_{12}$ appearing at this voltage dividing point 12A is selected to be lower than the triggering input voltage $V_B$ for the transistor type switching circuit 7 at the level of the input terminal voltage $V_{1B}$ appearing before the switching circuit 7 is actuated.

Figure 1B:
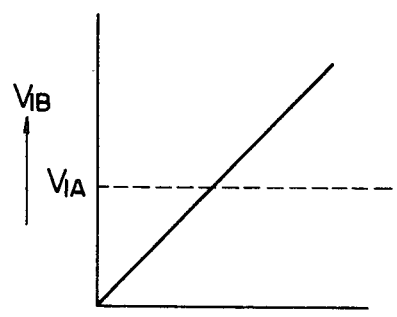
Figure 1C:
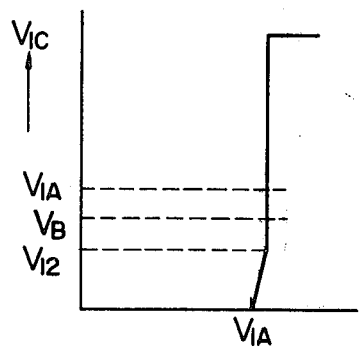

When the voltage $V_{1B}$ applied to the input terminal 1B of the operational amplifier 1 is increased to a level above the reference voltage $V_{1A}$ as shown in FIG. 1b, an output voltage $V_{1C}$ appears at the output terminal 1C of the operational amplifier 1 as shown in FIG. 1C. With this increase of this output voltage $V_{1C}$ to a level above the voltage $V_{12}$ appearing at the voltage dividing point 12A, the output voltage $V_{1C}$ makes a steep increase due to the voltage feedback action. Therefore, when the relation between the triggering voltage $V_B$ for the transistor type switching circuit 7 and the voltage $V_{12}$ appearing at the voltage dividing point 12A is selected to be $V_B > V_{12}$, the transistor type switching circuit 7 can be triggered by the steep change of the output voltage $V_{1C}$ and can operate stably.

Figure 2A:
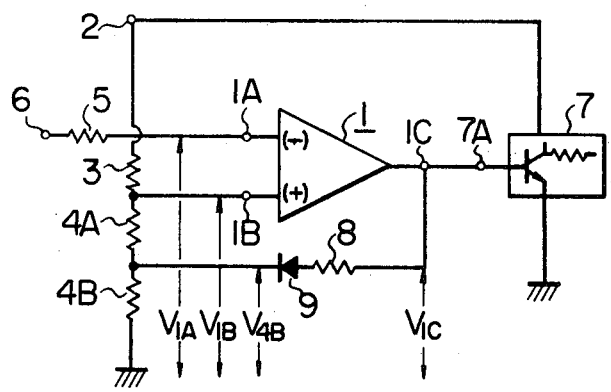
FIG. 2a is a circuit diagram of another embodiment of the present invention.

Another embodiment of the present invention will be described with reference to a level detector of the kind in which a reference potential is applied to the (+) input terminal of an operational amplifier as shown in FIG. 2a.

Referring to FIG. 2a, a reference voltage $V_{1B}$ obtained by dividing a power supply voltage by voltage dividing resistors 3, 4A and 4B is applied to the (+) input terminal 1B of an operational amplifier 1. The (−) input terminal 1A of the operational amplifier 1 is connected through a resistor 5 to a detected signal input terminal 6, and the output terminal 1C of the operational amplifier 1 is connected to the voltage dividing point between the voltage dividing resistors 4A and 4B through a feedback circuit including a resistor 8 and a diode 9. The voltage $V_{4B}$ appearing at this voltage dividing point is selected to be lower than the triggering input voltage $V_B$ for a transistor type switching circuit 7 which is connected to the output terminal 1C of the operational amplifier 1.

Figure 2B:
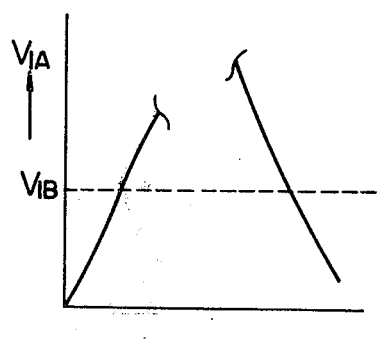
Figure 2C:
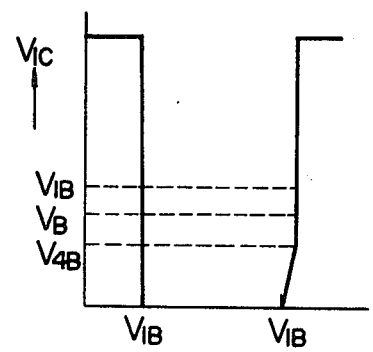

As shown in FIGS. 2b and 2c, the full output voltage is delivered from the operational amplifier 1 in the region in which the input voltage $V_{1A}$ applied to the input voltage 1A is sufficiently low compared with the reference voltage $V_{1B}$ and the output voltage $V_{1C}$ is maintained in a saturated state. However, in the region except this saturation region, the feedback circuit is actuated to reduce the output voltage $V_{1C}$ to zero. Then, when the input voltage $V_{1A}$ is reduced to a level which provides the relation $V_{1A} < V_{1B}$, the output voltage $V_{1C}$ appears again. This output voltage $V_{1C}$ is applied to the reference voltage circuit through the feedback circuit, and when the relation $V_{1C} > V_{4B}$ is established, the output voltage $V_{1C}$ makes a steep increase due to the feedback action. In this embodiment too, the voltage $V_{4B}$ appearing at the voltage dividing point between the voltage dividing resistors 4A and 4B can be very easily selected to be lower than the triggering input voltage $V_B$ for the transistor type switching circuit 7 as in the preceding embodiment. Therefore, the transistor type switching circuit 7 can deliver a stable output.

It will be understood that the foregoing description that the present invention can ensure stable feedback of voltage to a level detector even when the operating voltage level of a circuit network connected to the output terminal of the level detector is low. Thus, the present invention can be very advantageously applied to a level detector network utilizing means such as existing integrated circuits.

What is claimed is:

1. A feedback circuit for use in a level detector having a comparing amplifier, means for applying a reference voltage to a first input terminal circuit of said comparing amplifier, means for applying a detected signal voltage to a second input terminal circuit of said comparing amplifier, and switching circuit connected to an output terminal circuit of said comparing amplifier and having a triggering input voltage level lower than said reference voltage, said feedback circuit comprising voltage dividing means for dividing the voltage of said second input terminal circuit to obtain a voltage lower than the triggering input voltage for said switching circuit in the region in which the voltage appearing at said output terminal circuit is lower than said triggering input voltage, and feedback means connected at one end thereof to said ouput terminal of said comparing amplifier and at the other end thereof to the voltage dividing point of said voltage dividing means.

2. A feedback circuit for use in a level detector comprising a comparing amplifier, a switching circuit connected to an output terminal of said comparing amplifier and having a triggering input voltage level lower than a reference voltage, voltage dividing resistor means connected to a positive power supply and a applying the reference voltage to the (−) input terminal of said comparing amplifier, an input terminal for applying a detected signal voltage to the (+) input terminal of said comparing amplifier, voltage dividing resistor means connected to said detected signal voltage input terminal, and a resistor and a diode connected in series between said last-mentioned voltage dividing resistor means and the output terminal of said comparing amplifier.

3. A feedback circuit for use in a level detector comprising a comparing amplifier, a switching circuit connected to an output terminal of said comparing amplifier and having a triggering input voltage level lower than a reference voltage, voltage dividing resistor means connected to a positive power supply for applying the reference voltage to the (+) input terminal of said comparing amplifier, an input terminal for applying a detected signal voltage to the (−) input terminal of said comparing amplifier, and a resistor and a diode connected in series between a point in said voltage dividing resistor means where the voltage is lower than said reference voltage and the output terminal of said comparing amplifier.

4. A feedback circuit for use in a level detector having a comparing amplifier, means for applying a reference voltage to a first input terminal circuit of said comparing amplifier, means for applying a detected signal voltage to a second input terminal circuit of said comparing amplifier, one of said first and second input terminals being a (+) input terminal and the other of said first and second input terminals being a (−) input terminal, and a switching circuit connected to an output terminal circuit of said comparing amplifier and having a triggering input voltage level lower than said reference voltage, said feedback circuit including means providing a positive feedback of the output of the comparing amplifier to the (+) input terminal of the comparing amplifier prior to the output of the comparing amplifier attaining the level of the triggering input voltage for said switching circuit.

5. A feedback circuit according to claim 4 wherein said means providing a positive feedback includes a voltage dividing means for dividing the voltage of said second input terminal circuit to obtain a voltage lower than the triggering input voltage for said switching circuit in the region in which the voltage appearing at said output terminal circuit is lower than said triggering input voltage, and said feedback means being connected at one end thereof to said output terminal of said comparing amplifier and at the other end thereof to the voltage dividing point of said voltage dividing means.

6. A feedback circuit according to claim 4, wherein said means for applying a reference voltage to a first input terminal circuit of said comparing amplifier includes first voltage dividing resistor means connected to a positive power supply for applying the reference voltage to the (−) input terminal of said comparing amplifier, said detected signal voltage being applied to the (+) input terminal of said comparing amplifier, said positive feedback means including voltage dividing resistor means connected to said detected signal voltage input terminal, and a resistor and a diode connected in series between said second voltage dividing resistor means and the output terminal of said comparing amplifier.

7. A feedback circuit according to claim 4 wherein said means for applying a reference voltage to a first input terminal circuit of said comparing amplifier includes voltage dividing resistor means connected to a positive power supply for applying the reference voltage to the (+) input terminal of said comparing amplifier, said detected signal voltage being applied to he (−) input terminal of said comparing amplifier, said means providing a positive feedback including a resistor and a diode connected in series between a point in said voltage dividing resistor means where the voltage is lower than said reference voltage in the output terminal of said comparing amplifier.

* * * * *